United States Patent [19]

Simpson et al.

[11] Patent Number: 5,122,738
[45] Date of Patent: Jun. 16, 1992

[54] INTEGRATED CIRCUIT HAVING LOGIC CIRCUITS WITH LATCH ELEMENTS CONNECTABLE IN SHIFT REGISTER CONFIGURATION FOR TESTING

[75] Inventors: Richard D. Simpson, Houston, Tex.; Iain C. Robertson, Bedford, England

[73] Assignee: Texas Instruments Incorporated, Dallas, Tex.

[21] Appl. No.: 594,517

[22] Filed: Oct. 9, 1990

Related U.S. Application Data

[62] Division of Ser. No. 373,123, Jun. 28, 1989, Pat. No. 4,992,727.

[30] Foreign Application Priority Data

Jun. 29, 1988 [GB] United Kingdom ............... 8815417

[51] Int. Cl.⁵ .............................................. G01R 31/28
[52] U.S. Cl. .................................... 324/158 R; 324/158 T; 371/21.1; 371/22.1
[58] Field of Search ............... 324/158 R, 158 T, 73.1; 371/21.1, 22.3, 25.1, 22.1, 21.4; 365/201

[56] References Cited

U.S. PATENT DOCUMENTS

| | | | |
|---|---|---|---|
| 4,580,137 | 4/1986 | Fiedler et al. | 371/22.3 |
| 4,602,210 | 7/1986 | Fasang et al. | 371/22.3 |
| 4,698,588 | 10/1987 | Hwang et al. | 324/158 R |
| 4,856,002 | 8/1989 | Sakashita et al. | 371/22.3 |

Primary Examiner—Ernest F. Karlsen
Attorney, Agent, or Firm—William E. Hiller; Richard L. Donaldson

[57] ABSTRACT

A digital data storage circuit for a digital signal processor which is capable of receiving asynchronous inputs and is such as to be testable by selectively configuring the storage circuits as a shift register enabling the entry and extraction of test data into the processor. The storage circuit includes two latch elements each formed by two complementary transistor inverter circuits connected in a positive feedback arrangement and in which the output current capability of the second inverter circuit is restricted to enable the latch element to change state in response to input signals applied to it. Asynchronous inputs are applied to a first latch element through switch means comprising a complementary transistor inverter responsive to a SET input in series with a transistor responsive to a CLEAR input. The complementary inverter is connected to the input of the first latch element through a series connected transistor. During testing the series connected transistor is blocked and the first latch element is connected in a two elements per bit shift register configuration with the second latch element by series connected transistors controlled by antiphase square waves.

5 Claims, 1 Drawing Sheet

INTEGRATED CIRCUIT HAVING LOGIC CIRCUITS WITH LATCH ELEMENTS CONNECTABLE IN SHIFT REGISTER CONFIGURATION FOR TESTING

This is a division of application Ser. No. 373,123, filed June 28, 1989, now U.S. Pat. No. 4,992,727.

BACKGROUND OF THE INVENTION

1. Field of the Invention

This invention relates to integrated circuits and in particular to a testable latch for latching asynchronous signals, the latch being suitable for use in an integrated circuit.

2. Brief Description of the Prior Art

In the manufacture of microprocessors and other digital signal processors, it is essential to be able to test the functioning of the different parts of the circuit. The testing is typically achieved by providing in the processor an alternative set of interconnections among all the latches so that they are joined together to form a single shift register. In order to effect the testing, a pattern of 1's and 0's is stepped in through the shift register connection to set the latches to known states. The microprocessor is then reconfigured to its normal functional connections and is caused to operate normally for at least one clock cycle. After that the data stored in the latches is stepped out along the shift register path and compared with the output expected. In this way failure of the microprocessor to perform the required logical operations can be detected and the likely cause of such failures pinpointed in the device. This test also enables the ability of the latches to store both the "1" state and the "0" state satisfactorily to be checked satisfactorily.

In order to implement this testing operation each latch in the microprocessor must be provided with selectable inputs, at least one for its normal operation and at least another for connecting the latches together in the shift register configuration.

Some latches in many microprocessors are intended to respond to asynchronous inputs, for example, inputs which arise from outside the device. An asynchronous input takes the form of a SET signal on one conductor defining the transition to the "1" state and a CLEAR signal on another conductor defining the transition to the "0" state. Asynchronous signals are usually latched using a pair of cross-coupled NAND-gates to form a bistable element with separate SET and CLEAR inputs applied in inverted form to the two NAND-gates. Although it would be possible to connect such a latch into a shift register with other latches so that it could be tested in the manner described above, it would require a large amount of additional circuitry to provide the additional connections in the inputs to the latch required to produce the shift register configuration. Moreover, since the additional circuitry is required to produce the shift register configuration it cannot be tested independently of the latches.

It is an object of the present invention to provide a testable digital data storage circuit in which the above difficulties are substantially overcome.

SUMMARY OF THE INVENTION

According to a first aspect of the present invention there is provided a testable digital data storage circuit for use in an integrated circuit including first and second two-state latch elements, each of which in use produces an output in the form of a selected one of two voltage levels, depending only on whether an input signal applied to the particular element is above or below a threshold voltage, an input terminal for an input signal to the circuit, a first output terminal connected to the output of the first latch element, switch means responsive to asynchronous input signals to establish one of two voltage levels selectively, and first gating means connected to apply the voltage level established by the switch means to the input of the first latch element. To enable the circuit to be tested, second and third gating means are provided respectively connected from a test input terminal to the input of the first latch element and from the output of the first latch element to the input of the second latch element, the output of the second latch element being connected to a test output terminal, during normal operation the first gating means being maintained open to pass the voltage level to the first latch element and during testing the first gating means being closed and the second and third gating means being opened alternately.

According to a second aspect of the present invention, there is provided a testable integrated circuit having a plurality of latch elements interconnected by logic circuits, at least one of the latch elements being adapted to receive asynchronous inputs, and in which for testing purposes, the latch elements can be joined in a shift register configuration for entry and extraction of data bits, wherein each latch element which is adapted to receive asynchronous inputs in use, produces an output in the form of one of two voltage levels depending only on whether a signal applied to an input terminal is above or below a threshold voltage and includes switch means responsive to the asynchronous inputs to apply a signal voltage above the threshold voltage or a signal voltage below the threshold voltage to the input terminal selectively.

The switch means may include a first transistor rendered conducting by a SET signal for conveying a first supply voltage to an output of the switch means and a second transistor rendered conducting by a CLEAR signal for conveying a second supply voltage different from the first supply voltage to the output of the switch means. The switch means may include a further transistor controlled by either the SET or CLEAR signal input connected in series with the second or first transistor so that the two supply voltages are not directly connected together if both the SET and CLEAR signals are present at the same time.

Each of the two-state latch elements may consist of a first complementary transistor inverter circuit connected to a second complementary transistor inverter circuit of restricted output current capability, the input of the latch element being connected to the input of the first inverter and the output of the latch element being connected to the output of the first inverter. The output of the second inverter serves to maintain the state, SET or RESET, into which the latch is switched by an input signal, and the restricted output current capability of the second inverter permits the state of the latch to be changed because it can be overridden by the current of an input signal applied to the input of the latch.

In the example to be described, the transistors are MOS transistors, but the circuit could be constructed using bipolar transistors or a mixture of bipolar and MOS transistors.

BRIEF DESCRIPTION OF THE DRAWINGS

One example of a testable digital storage circuit will now be described with reference to the accompanying drawings, of which.

DESCRIPTION OF THE PREFERRED EMBODIMENT

Figure 1:
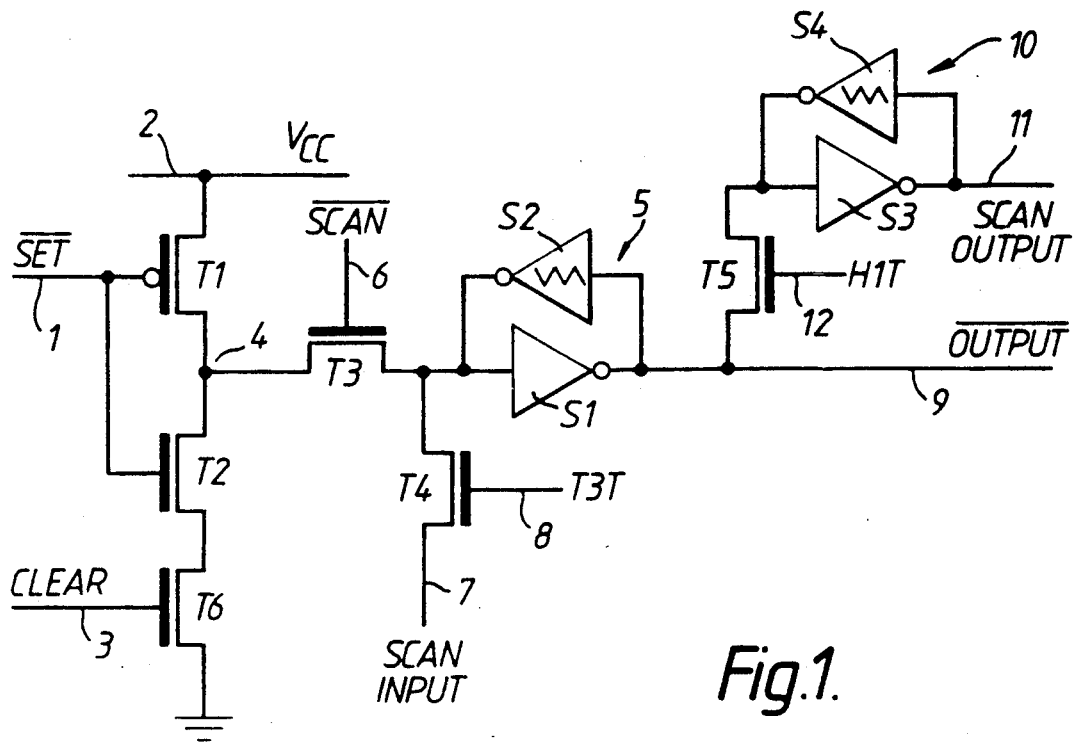
FIG. 1 is a circuit diagram of the example.

In FIG. 1 a $\overline{\text{SET}}$ input on a conductor 1 is connected to the gates of a P-channel MOSFET T1 and an N-channel MOSFET T2. In accordance with convention, a bar over the name of a signal, in this case SET, indicates that it is low when active. The channels of the transistors T1 and T2, which are their controlled current paths, are connected in series from a conductor 2, connected to a positive supply voltage VCC, to the channel of another N-channel MOSFET T6, the drain of which is connected to ground. The gate of the transistor T6 is connected to a conductor 3 to receive a CLEAR input signal. The signals $\overline{\text{SET}}$ and CLEAR come from an external source, for example, and consequently are asynchronous; that is to say their timing is not necessarily related to that of the clock and other signals applied to the circuit. The junction 4 of the channels of the transistors T1 and T2 is connected through the channel of an N-channel MOSFET T3 to the input of a latch element 5. The gate of the transistor T3 is connected to a conductor 6 through which it receives a control signal $\overline{\text{SCAN}}$. The input of the latch element 5 is also connected through the channel of an N-channel MOSFET T4 to a conductor 7 from which it receives data from other latch elements when the latch elements are configured as a shift register. The gate of the transistor T4 is connected to a conductor 8 from which it receives a clock signal T3T.

The latch element 5 consists of an inverter S1 with a feedback inverter S2 connected from its output to its input. The inverter S2 has a restricted output current capability so as to permit the state of the latch element to be set by a signal applied to its input. The output of the latch element is connected to a conductor 9 on which appears the output of the storage circuit in inverted form. The conductor 9 is connected to logic and/or other circuitry of a processor in which the storage circuit is built.

The conductor 9 is connected through the channel of an N-channel MOSFET T5 to the input of a second latch element 10, the output of which appears on a conductor 11 and is connected to the input of another storage circuit similar to that shown in FIG. 1 to provide a connection between the storage circuits in the shift register configuration. The gate of the transistor 5 is connected to a conductor 1 on which appears a clock signal H1T. The latch element 10 consists of two inverters S3 and S4 connected in a similar way to the inverters S1 and S2 of the latch 5. The inverter S4 has a restricted output current capability.

In the normal operation of the circuit shown in FIG. 1, the $\overline{\text{SCAN}}$ signal applied to the conductor 6 is high and the transistor T3 is conducting so that the input of the latch element 5 is connected to the junction 4 between the transistors T1 and T2. At this time the clock signal T3T is held low so that the transistor T4 is not conducting. Although the clock signal H1T is always present so that the output is transferred to the latch 10, this does not interfere with the normal operation of the circuit because the transistor T4 of the succeeding circuit is blocked. The signal $\overline{\text{SET}}$ from an external source, for example, when low will cause the transistor T1 to conduct and the transistor T2 to be non-conducting which would provide a high level at the junction 4 causing the output of the latch element 5 to go low. This output is conveyed by the conductor 9 to logic and/or other components not shown in FIG. 1. The voltage at the junction 4 will be held low, that is to say, close to ground potential when the $\overline{\text{SET}}$ signal 1 is high and the CLEAR signal applied to the conductor 3 is also high, so that both transistors T2 and T6 are conducting. At this time the transistor T1 is not conducting. The provision of the transistor T2 in addition to the transistor T6 serves to prevent an inadvertent short-circuiting of the supply conductor 2 to ground should the $\overline{\text{SET}}$ signal be low at the same time as the CLEAR signal is high. Instead of the transistor T2, a transistor rendered non-conducting by the CLEAR signal may be provided in series with the transistor T1.

When it is required to test the functioning of the processor of which the storage circuit shown in FIG. 1 is a part, the latch elements 5 and 10 are connected in a shift register configuration with the latch elements of other storage circuits in the processor through the transistors T4 and T5. Because the clock signal H1T is always present the state of the latch element 10 always follows that of the latch element 5, which means that as soon as the clock T3T is started the latch element 5 receives the state of the preceding latch element 10 in the shift register. Since the timing of changes of state of the latch element 5 in response to the $\overline{\text{SET}}$ and CLEAR signals relative to the pulses of the clock signals H1T and T3T is not fixed it is possible that the latch element 5 will be changing state when the transistor T5 becomes conducting. The latch element 10, however, adopts either the "0" or the "1" state in response to the input it receives from the latch element 5, thereby avoiding the stepping of an indeterminate state along the shift register. When the latch elements are operated in a shift register configuration the $\overline{\text{SCAN}}$ input applied to the conductor 6 is low so that the normal input to the latch element 5 through the transistor T3 is disabled because the transistor T3 is held non-conducting. The clock signals T3T and H1T are square waves of opposite polarity so that when the transistor T4 is conducting the transistor T5 is non-conducting, and vice versa. A sequence of 1's and 0's is entered into the processor along the shift register formed by the latch elements such as 5 and 10 in each of the storage circuits of the processor. The shift register operates on a two elements per bit cycle. After the data bits are stored in the storage circuits as required, the operation of the shift register is stopped and the processor caused to operate normally for at least one clock cycle by opening the transistors such as T3 again. When the operations required of the processor have been performed, the resulting data bits stored in the storage elements are then shifted out along the shift register path with the transistors such as T3 blocked. In this way the functioning of the logic and other circuits interconnecting the storage elements can be tested.

Figure 2:
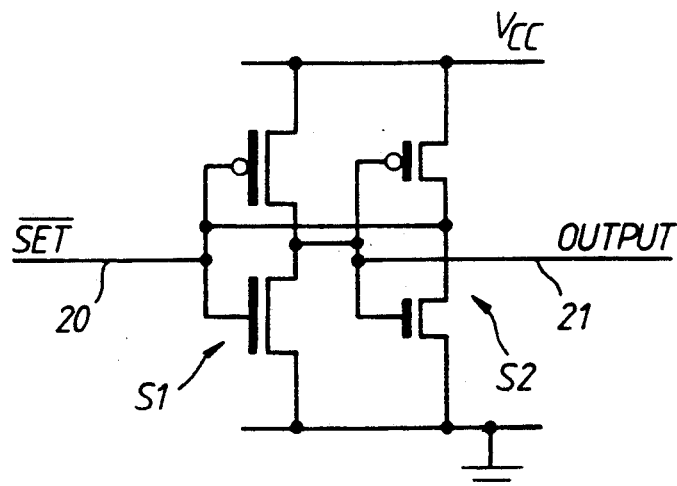
FIG. 2 is the circuit diagram of one form of latch element which could be used in the example of FIG. 1.

FIG. 2 shows one example of the construction of a latch element using CMOS technology. In FIG. 2, the input to the latch element is applied along conductor 20 and the output appears on a conductor 21. The element consists of two CMOS inverters, S1 and S2, corresponding to the components of the latch element 5 of FIG. 1. As shown in FIG. 2, the transistors of the inverter S2 are smaller than the transistors of the inverter S1, so that the output current capability of the inverter S2 is relatively restricted and can be overridden by the current of an input signal applied to the conductor 20. If the current were not so restricted, the inverter S2 would oppose any change to the voltage on the conductor 20 and it would not be possible to change the state of the latch element. On the other hand, the positive feedback provided by the inverter S2 serves to hold the latch element in the state to which it has been set.

The output current of the inverter S2 (and S4) may be restricted in other ways than using transistors that are smaller. For example, a resistor may be incorporated in the output connection of the inverter to restrict the current.

The latch elements may be of a different construction from that described provided that they can latch a state according to the level of a single input signal. It is not necessary for all of the latch elements to be of the same construction.

Although the digital data storage circuit has been described with reference to an example using MOS transistors, it could alternatively be constructed using bipolar transistors or a mixture of bipolar and MOS transistors.

The transistors T1, T2 and T6 may be replaced by other switch means responsive to the asynchronous SET and CLEAR signals, upright or inverted, and capable of applying the required logic signal levels to the latch element 5. Unless the signals SET and CLEAR are such that they cannot both be active at the same time, the switch means should be arranged so that the sources of the logic signal levels are not short-circuited when the signals SET and CLEAR are both active at the same time.

Each of the transistors T3, T4 and T5 may be replaced by another form of gate capable of transferring signal levels in the manner described above.

Different forms of switch means and gate may be used in different places in the circuit.

The digital data storage circuit described above has the advantage that it requires relatively few additional components to provide for the testing of the processor in which it is to be incorporated and that no combinatorial logic is included in the shift register.

What we claim is:

1. A testable integrated circuit comprising:
    a plurality of interconnected logic circuits;
    a plurality of latch elements, said plurality of latch elements including a respective set of latch elements in each of said plurality of logic circuits;
    at least one of said plurality of latch elements being adapted to receive asynchronous input signals;
    means for connecting said plurality of latch elements in a shift register configuration for testing purposes in the entry of data bits and the extraction of data bits therefrom;
    each of said plurality of logic circuits including an input terminal connected to the input of a first latch element provided in said logic circuit; and
    switch means connected to the input terminal and responsive to the asynchronous signal inputs for selectively applying a signal voltage above a threshold voltage or a signal voltage below a threshold voltage to said input terminal;
    said at least one latch element producing an output signal in the form of one of two voltage levels depending only on whether a signal applied to said input terminal is above or below said threshold voltage.

2. A testable integrated circuit as set forth in claim 1, wherein said switch means includes first and second transistors;
    a first supply conductor connecting said first transistor of said switch means to said input terminal which is connected to the input of said first latch element provided in said logic circuit;
    a second supply conductor connecting said second transistor of said switch mean to said input terminal connected to the input of said first latch element provided in said logic circuit; and
    said first and second transistors being alternatively rendered conductive in response to a SET signal applied to said first transistor and a CLEAR signal applied to said second transistor respectively.

3. A testable integrated circuit as set forth in claim 2, wherein said switch means further includes a third transistor connected in series with either of said first or second transistors, said third transistor being rendered non-conductive by applying either the SET signal or the CLEAR signal thereto such that said first and second supply conductors are not connected together at said input terminal when both the SET signal and the CLEAR signal are present at the same time.

4. A testable integrated circuit as set forth in claim 1, wherein each of said plurality of logic circuits includes gating means operably associated with the first latch element of said logic circuit and effective to block inputs to said first latch element from said input terminal when said first latch element is disposed in said shift register configuration during testing; and
    a plurality of further latch elements being provided respectively connected to receive data from the first-mentioned latch elements such that the shift register configuration operates as a two elements per bit register.

5. A testable integrated circuit comprising:
    a plurality of interconnected logic circuits;
    each of said plurality of logic circuits including:
        first and second two-state latch elements, each of said latch elements, in use, producing an output in the form of a selected one of two voltage levels depending only on whether an input signal applied to the particular latch element is above or below a predetermined threshold voltage,
        an input terminal for receiving an input signal, a first output terminal connected to the output of the first latch element,
        switch means responsive to asynchronous input signals to establish one of two voltage levels selectively,
        first gating means connected to apply the voltage level established by the switch means to the input of the first latch element,
        test input and test output terminals,
        second and third gating means respectively connected from said test input terminal to the input of the first latch element and from the output of the first latch element to the input of the second latch element, the output of the second latch element being connected to said test output terminal, and means to maintain, during normal operation, the first gating means open to pass the voltage level to the first latch element and to maintain, during testing, the first gating means closed and the second and third gating means alternately open; and means for connecting said first and second latch elements of one of said plurality of logic circuits to said first and second latch elements of a successive one of said plurality of logic circuits in a shift register configuration in a continuing sequence to include all of said plurality of logic circuits for testing purposes in the entry of data bits and the extraction of data bits therefrom.

* * * * *